United States Patent
Wang et al.

(10) Patent No.: US 9,234,935 B2
(45) Date of Patent: Jan. 12, 2016

(54) AUTOMATION TESTING SYSTEM FOR TESTING A MOTHERBOARD

(71) Applicant: Wistron Corporation, New Taipei (TW)

(72) Inventors: Pei-Chih Wang, New Taipei (TW); Xingxing Wang, New Taipei (TW); Fei Wang, New Taipei (TW); Haiyang Li, New Taipei (TW); Zhaohong Han, New Taipei (TW); Haibin Xin, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 218 days.

(21) Appl. No.: 14/183,530

(22) Filed: Feb. 19, 2014

(65) Prior Publication Data

US 2015/0115988 A1    Apr. 30, 2015

(30) Foreign Application Priority Data

Oct. 31, 2013    (CN) .......................... 2013 1 0530523

(51) Int. Cl.
*G01R 31/28*    (2006.01)

(52) U.S. Cl.
CPC .................................. *G01R 31/2808* (2013.01)

(58) Field of Classification Search
CPC ........... G01R 31/2808; G01R 31/2806; G01R 1/07328; G01R 31/2801
See application file for complete search history.

(56) References Cited

U.S. PATENT DOCUMENTS

| | | | | |
|---|---|---|---|---|
| 5,104,277 A | * | 4/1992 | Bullock | H05K 13/0061 198/345.1 |
| 6,084,422 A | * | 7/2000 | Bartholomew | G01R 31/2801 324/754.13 |
| 2003/0179006 A1 | * | 9/2003 | Seppala | G01R 31/2806 324/750.15 |
| 2008/0205005 A1 | * | 8/2008 | Chen | G01R 31/2808 361/719 |

FOREIGN PATENT DOCUMENTS

| CN | 2574079 Y | 9/2003 |
|---|---|---|
| TW | M377593 | 4/2010 |

OTHER PUBLICATIONS

Office action mailed on Mar. 31, 2015 for the Taiwan application No. 102142415, filing date: Nov. 21, 2013, p. 1 line 12-14 and p. 2 line 1-26.

* cited by examiner

*Primary Examiner* — Tung X Nguyen
*Assistant Examiner* — Feba Pothen
(74) *Attorney, Agent, or Firm* — Winston Hsu; Scott Margo

(57) ABSTRACT

An automation testing system for testing a motherboard includes a frame, a first jig plate, a second jig plate, a platform, a first driving mechanism, a second driving mechanism and a console computer. The frame includes a track, a debug docking board is detachably disposed on the first jig plate for docking with the motherboard, the platform is slidably installed on the track and disposed between the first jig plate and the second jig plate, and the platform is for holding the motherboard. The console computer controls the first driving mechanism to drive the platform to move in a first direction along the track, and controls the second driving mechanism to drive the second jig plate to move in a second direction perpendicular to the first direction.

10 Claims, 10 Drawing Sheets

AUTOMATION TESTING SYSTEM FOR TESTING A MOTHERBOARD

BACKGROUND OF THE INVENTION

1. Field of the Invention

The present invention relates to a testing system, and more specifically, to an automation testing system for testing a motherboard.

2. Description of the Prior Art

Nowadays, electronic products, such as personal computers or notebook computers, are indispensable devices in human life. A motherboard is one of the most important electronic components of the electronic products, and the quality of the motherboard relates to the stability of the electronic products. For making sure of good quality of the motherboard, the motherboard needs to pass several tests before selling in order to confirm that various functions of the motherboard operate well. However, a conventional testing system for testing the motherboard needs to install a debug docking board on the motherboard manually and then put the motherboard on a platform. The conventional testing system cannot automatically test the motherboard, resulting in the waste of manpower. In addition, because of diversification of the motherboards, as testing different types of motherboards, it is necessary to replace different fixture probe boards to coordinate with the corresponding motherboards, so that it spends a lot of time in replacement. Therefore, there is a need to design an automation testing system to shorten the replacement time of the probe board and without the manual operation, so as to reduce the waste of manpower and time for improving the testing process.

SUMMARY OF THE INVENTION

The present invention relates to an automation testing system for testing a motherboard to solve the above-mentioned problem.

According to the disclosure, the automation testing system for testing the motherboard, the automation testing system including a frame, a first jig plate, a second jig plate, a platform, a first driving mechanism, a second driving mechanism and a console computer. The frame includes a track, the first jig plate is detachably disposed in the frame, a debug docking board is detachably disposed on the first jig plate, and the debug docking board includes a connector for connecting with the motherboard. The second jig plate is movably disposed in the frame. The platform is slidably installed on the track and disposed between the first jig plate and the second jig plate, the track is for guiding the platform to move in a first direction, and the platform is for loading the motherboard. The first driving mechanism is for driving the platform to move along the track in the first direction. The second driving mechanism is for driving the second jig plate to move in a second direction perpendicular to the first direction. The console computer is electrically connected to the debug docking board, the first driving mechanism and the second driving mechanism. The console computer is for controlling the first driving mechanism to drive the platform to a horizontal position, the console computer is further for controlling the second driving mechanism to drive the second jig plate to move in the second direction as the platform is located at the horizontal position, so that the second jig plate pushes the platform to move toward the first jig plate for docking the motherboard with the connector of the debug docking board so as to test the motherboard.

According to the disclosure, the first driving mechanism includes a transmission chain and a motor, the transmission chain is connected to the platform, and the motor is for driving the transmission chain to move the platform.

According to the disclosure, the second driving mechanism includes a plurality of guiding columns and a pneumatic cylinder, the plurality of guiding columns is for guiding the second jig plate to move in the second direction, and the pneumatic cylinder is for driving the second jig plate to move in the second direction so as to combine the first jig plate and the platform with the second jig plate or in a third direction opposite to the second direction.

According to the disclosure, the automation testing system further includes a resilient component contacting against the first jig plate and the motherboard, the resilient component is for pushing the motherboard to detach from the first jig plate as the pneumatic cylinder drives the second jig plate to move in the third direction.

According to the disclosure, the automation testing system further includes a plug detection unit including a plug detection module, a linear slide rail and a cylinder. The plug detection module is electrically connected to the console computer and for plugging into the motherboard so that the console computer tests the motherboard through the plug detection module. The linear slide rail is for guiding the plug detection module. The cylinder is connected to the plug detection module. The console computer is further for controlling the cylinder to push the plug detection module to plug into the motherboard for testing.

According to the disclosure, the console computer monitors the motherboard through a virtual network computing function.

According to the disclosure, the first jig plate or the second jig plate includes a probe, an end of the probe is electrically connected to the console computer, and the other end of the probe is for connecting with the motherboard, so as to electrically connect the console computer to the motherboard.

According to the disclosure, the automation testing system further includes a sensor for sensing a relative position between the motherboard and the platform, and the console computer is further for controlling the first driving mechanism and the second driving component according to a sensing result of the sensor.

According to the disclosure, the automation testing system further includes a barcode scanner electrically connected to the console computer, and the barcode scanner is for scanning a barcode on the motherboard and recording the barcode in the console computer.

According to the disclosure, a first positioning pillar and a second positioning pillar are disposed on the first jig plate and the second jig plate respectively, the first positioning pillar is inserted into a first positioning opening on the second jig plate, the second positioning pillar is inserted into a second positioning opening on the first jig plate so as to fix the first jig plate, the platform and the second jig plate.

According to the present invention, the debug docking board is installed on the first jig plate. As testing different kind of motherboards, just replace the debug docking boards instead of replacing the jig plate, the time spent in replacement and in adjustment can be decreased, and the jig plate can be manufactured standardized. During operation, all an operator needs to do is to load the motherboard on the platform without any other manual operation, and the testing system approaches fully automatic. The issue that the waste of manpower and time caused by installing the debug docking board on the motherboard manually and loading the motherboard on the testing system can be solved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
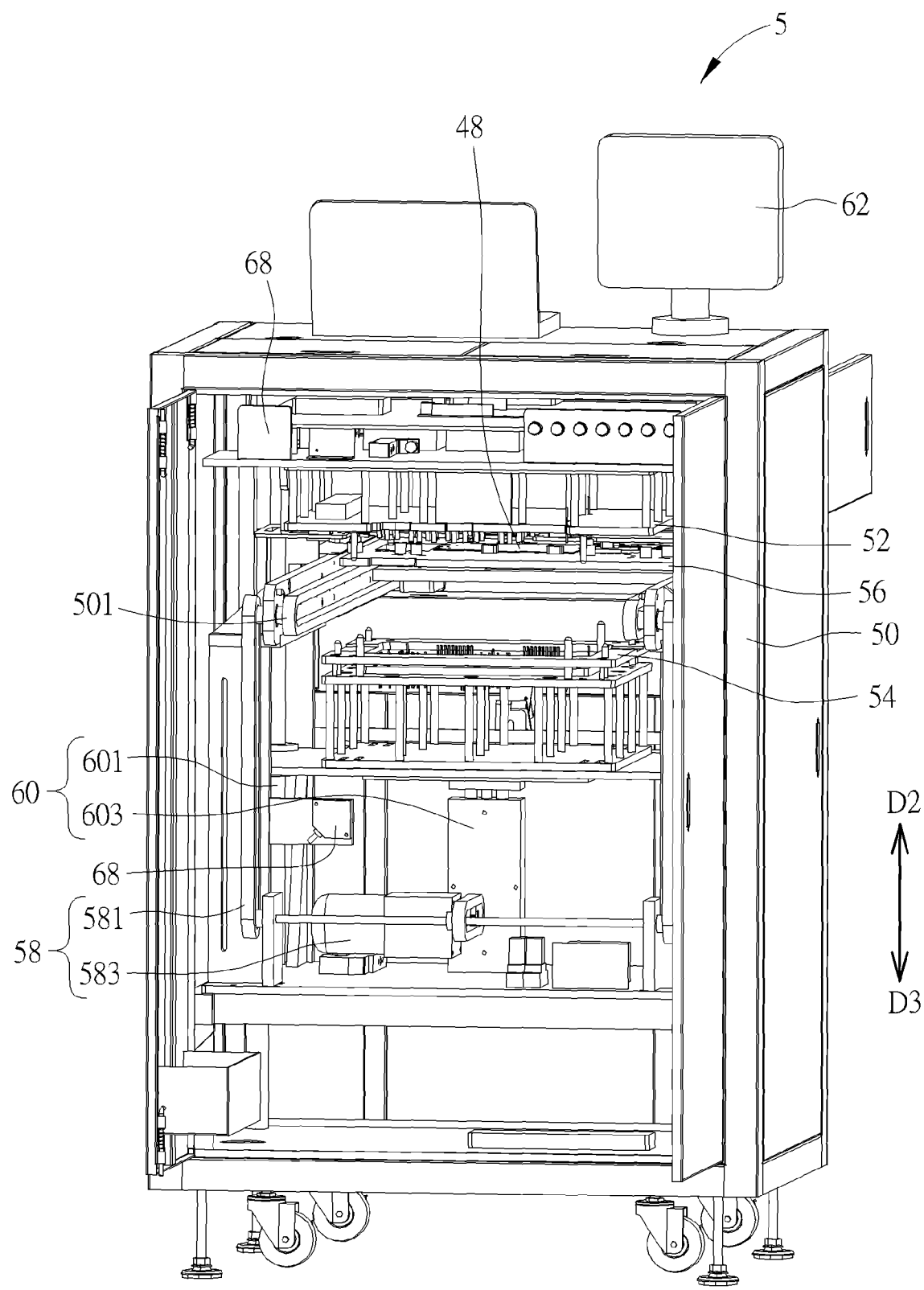
FIG. 1 to FIG. 3 are diagrams in different view angles of an automation testing system according to an embodiment of the present invention.
Figure 2:
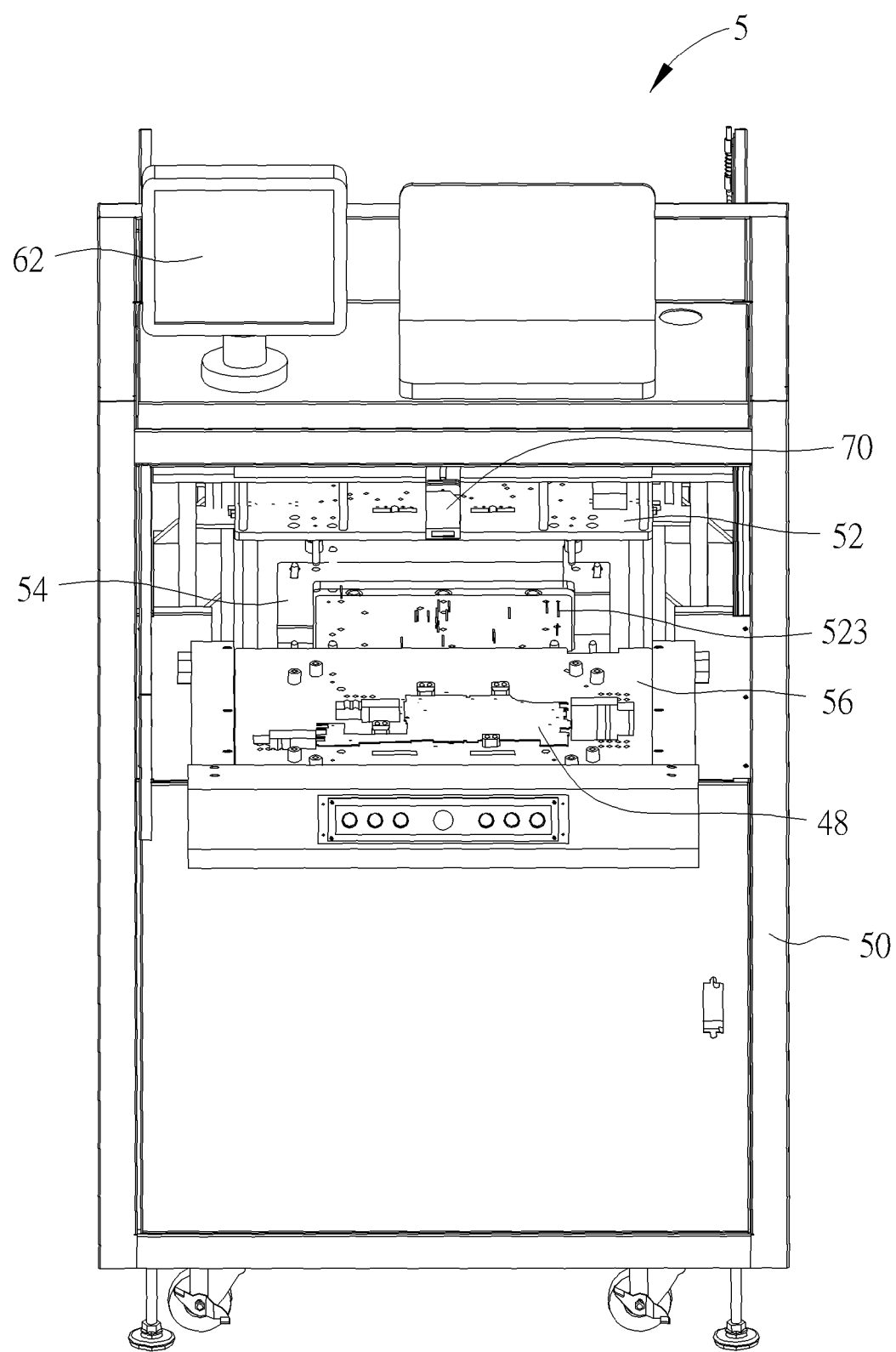
Figure 3:
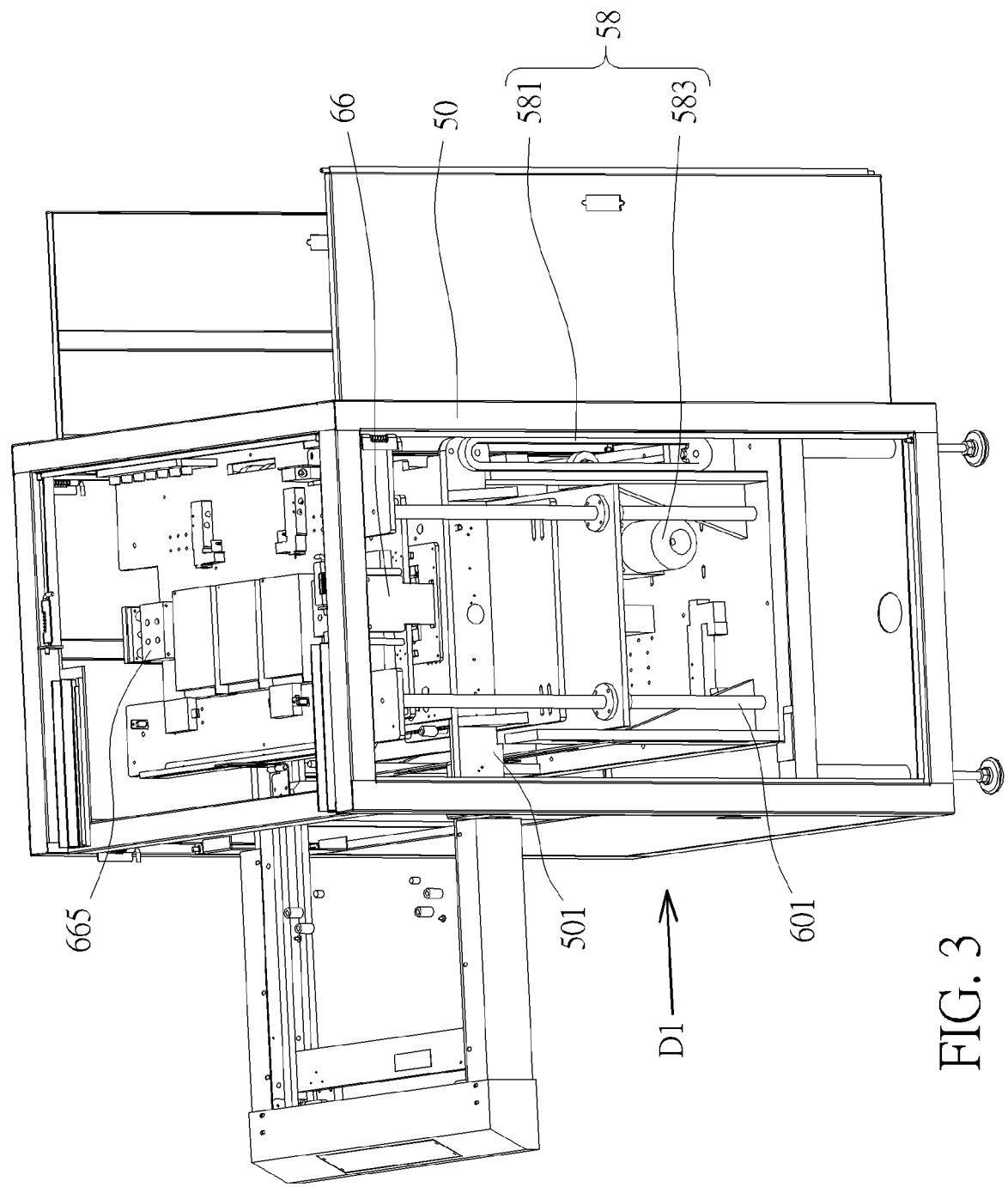

Please refer to FIG. 1 to FIG. 3. FIG. 1 to FIG. 3 are diagrams in different view angles of an automation testing system 5 according to an embodiment of the present invention. The automation testing system 5 for testing a motherboard 48 of the present invention includes a frame 50, a first jig plate 52, a second jig plate 54, a platform 56, a first driving mechanism 58, a second driving mechanism 60 and a console computer 62. The frame 50 includes a track 501. The first jig plate 52 is detachably disposed in the frame 50. The second jig plate 54 is movably disposed in the frame 50. The platform 56 is slidably installed on the track 501 and disposed between the first jig plate 52 and the second jig plate 54, the track 501 is for guiding the platform 56 to move in a first direction D1, and the platform 56 is for loading the motherboard 48. The first driving mechanism 58 includes a transmission chain 581 and a motor 583, the transmission chain 581 is connected to the platform 56, and the motor 583 is for driving the transmission chain 581 to move the platform 56 so as to drive the platform 56 to move along the track 501 in the first direction D1, as shown in FIG. 3. The second driving mechanism 60 is for driving the second jig plate 54 to move in a second direction D2 perpendicular to the first direction D1, as shown in FIG. 1.

The console computer 62 is electronic connected to the first driving mechanism 58 and the second driving mechanism 60, the console computer 62 is for controlling the first driving mechanism 58 to drive the platform 56 to move in the first direction D1 to a horizontal position, the console computer 62 is further for controlling the second driving mechanism 60 to drive the second jig plate 54 to move in the second direction D2 as the platform 56 is located at the horizontal position, so that the second jig plate 54 pushes the platform 56 to move toward the first jig plate 52 so as to combine the first jig plate 52, the platform 56 and the second jig plate 54.

In addition, the second driving mechanism 60 includes a plurality of guiding columns 601 and a pneumatic cylinder 603, the plurality of guiding columns 601 is for guiding the second jig plate 54 to move in the second direction D2, and the pneumatic cylinder 603 is for driving the second jig plate 54 to move in the second direction D2 or in a third direction D3 opposite to the second direction D2, so that the platform 56 and the second jig plate 54 is combined with or detached from the first jig plate 52.

Figure 4:
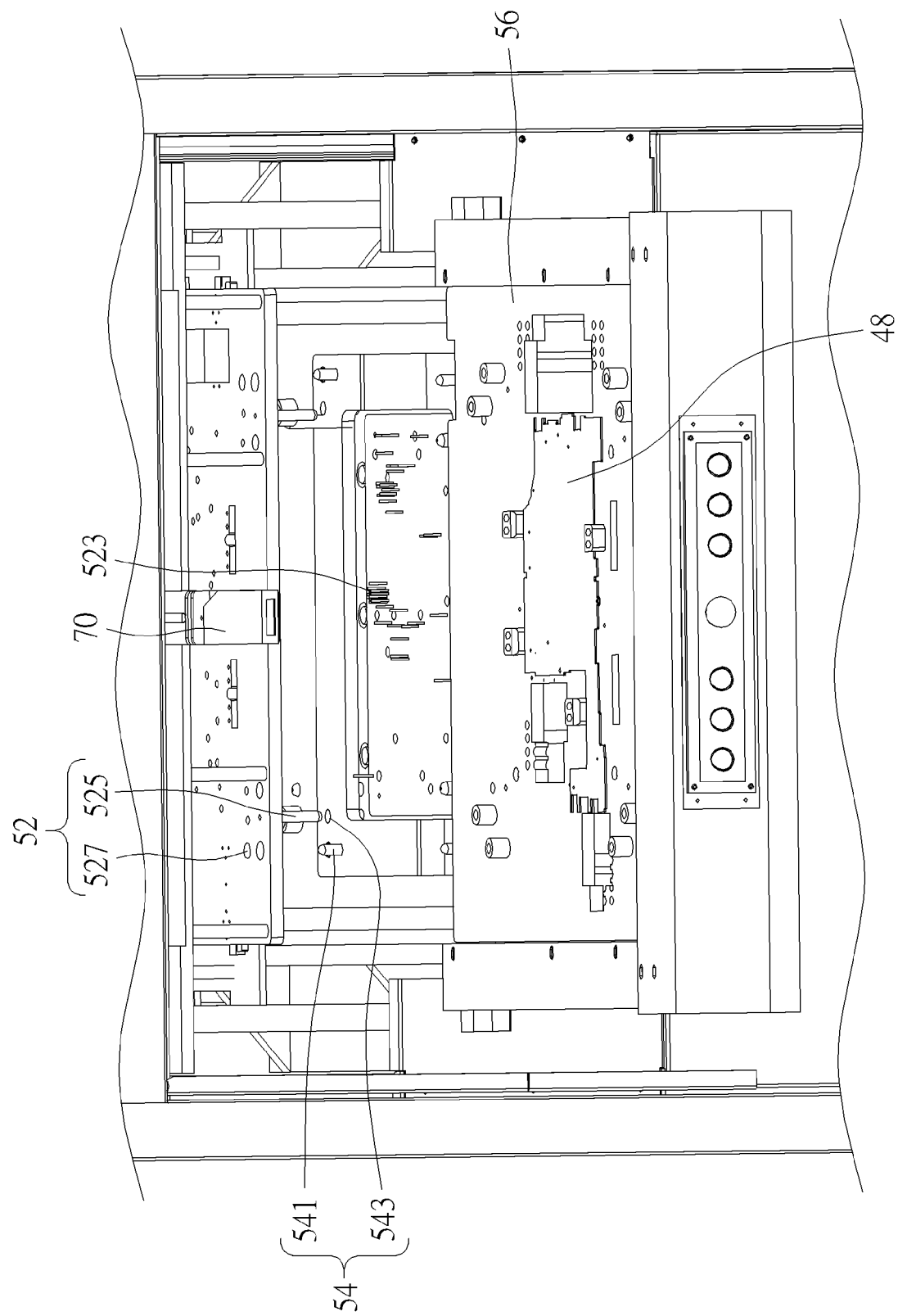
FIG. 4 is a partial enlarged diagram in a front view of the automation testing system according to the embodiment of the present invention.

Please refer to the FIG. 4. FIG. 4 is a partial enlarged diagram in a front view of the automation testing system 5 according to the embodiment of the present invention. According to the embodiment of the present invention, a first positioning pillar 525 and a second positioning pillar 541 are disposed on the first jig plate 52 and the second jig plate 54 respectively, the first positioning pillar 525 is inserted into a first positioning opening 543 on the second jig plate 54, the second positioning pillar 541 is inserted into a second positioning opening 527 on the first jig plate 52 so as to fix the first jig plate 52, the platform 56 and the second jig plate 54, and for guiding the first jig plate 52 to combine with the platform 56 and the second jig plate 54 directly.

Figure 5:
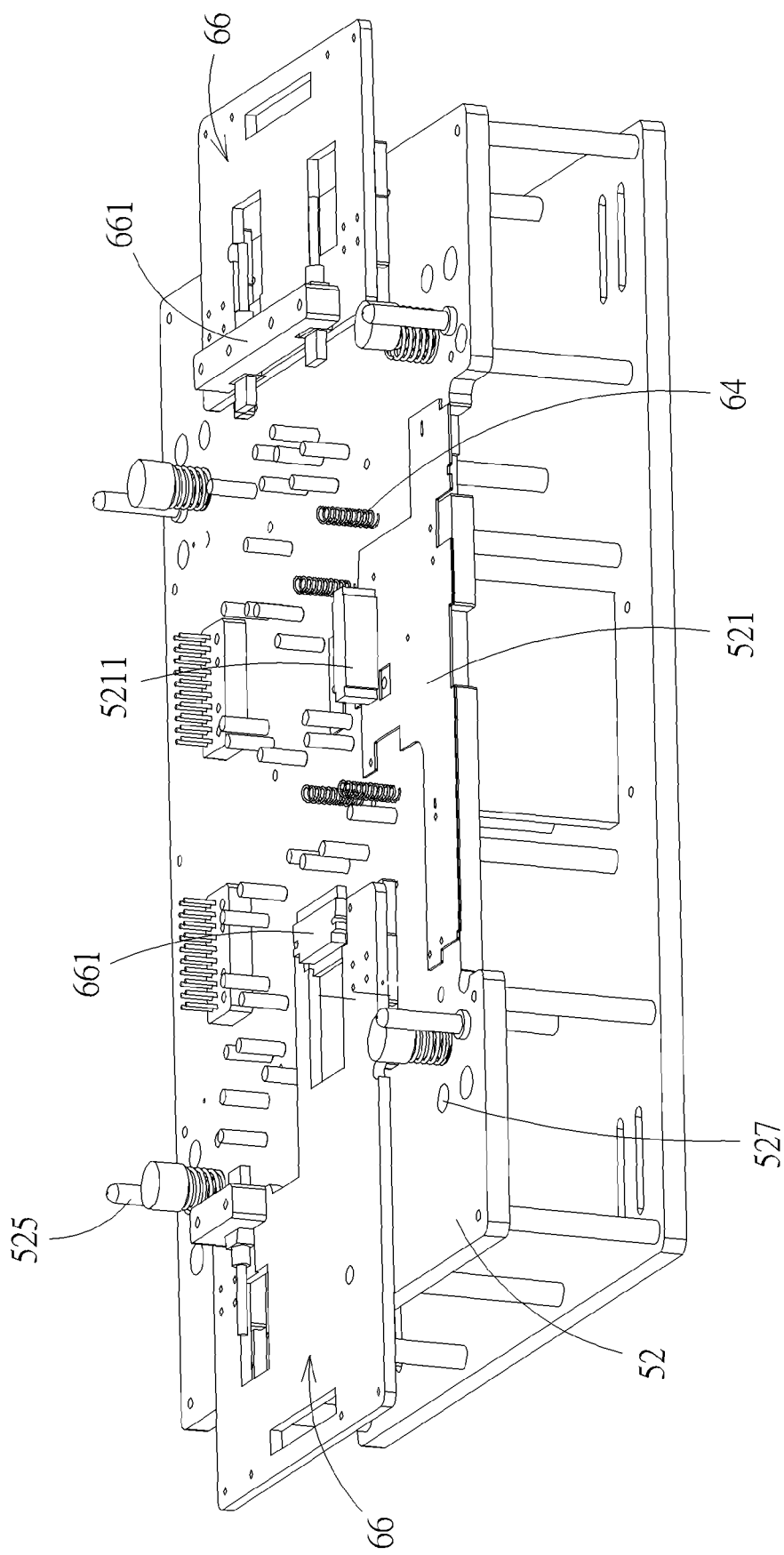
FIG. 5 is a diagram of a first jig plate according to the embodiment of the present invention.
Figure 6:
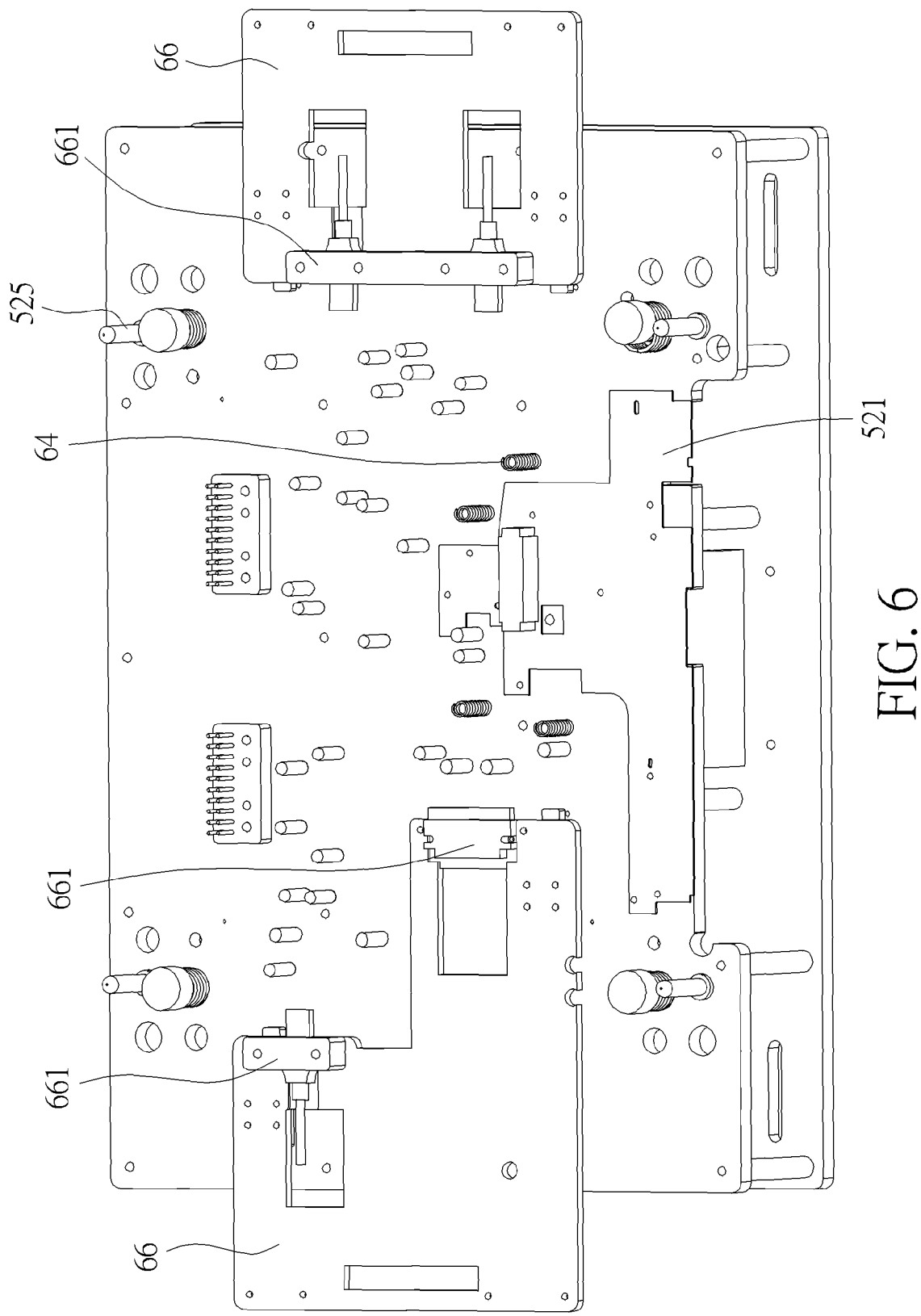
FIG. 6 is a diagram of the first jig plate in another view angle according to the embodiment of the present invention.

Please refer to FIG. 5 and FIG. 6. FIG. 5 is a diagram of a first jig plate 52 according to the embodiment of the present invention. FIG. 6 is a diagram of the first jig plate 52 in another view angle according to the embodiment of the present invention. A debug docking board 521 is detachably disposed on the first jig plate 52, the debug docking board 521 is electrically connected to the console computer 62 and including a connector 5211 so as to docking with the motherboard 48 and for testing the motherboard 48. In addition, it is able to install different debug docking boards 521 on the first jig plate 52 for testing different motherboards 48.

The automation testing system 5 further includes a resilient component 64 contacting against the first jig plate 52 and the motherboard 48. As the second jig plate 54 pushes the platform 56 to move toward the first jig plate 52 in the second direction D2 so as to combine the first jig plate 52, the platform 56, and the second jig plate 54, the resilient component 64 is for buffering the components so as to prevent colliding. As the second jig plate 54 moves in the third direction D3, the resilient component 64 provides resilient force to push the motherboard 48 to detach from the first jig plate 52.

Figure 7:
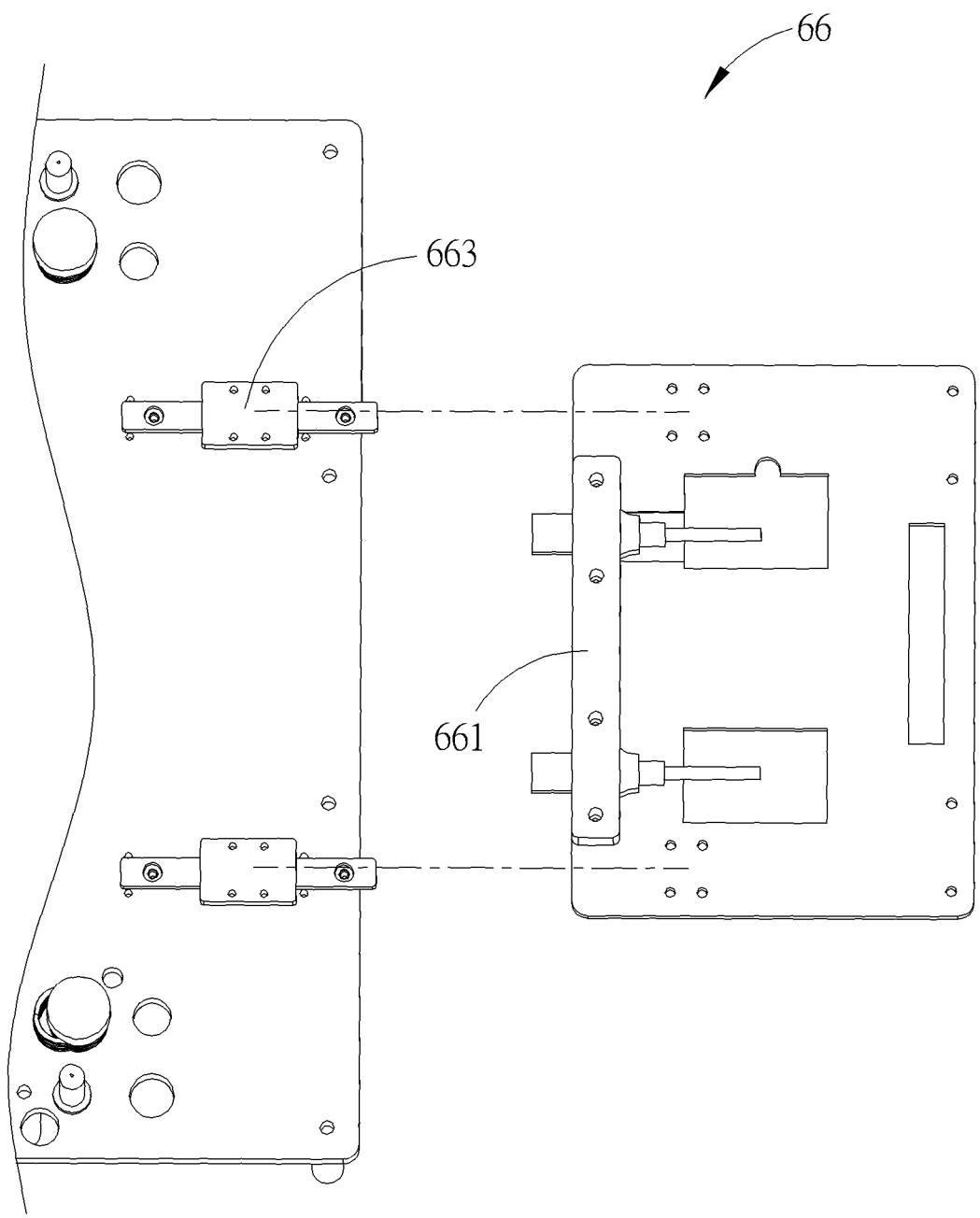
FIG. 7 is an exploded diagram of a plug detection unit according to the embodiment of the present invention.
Figure 8:
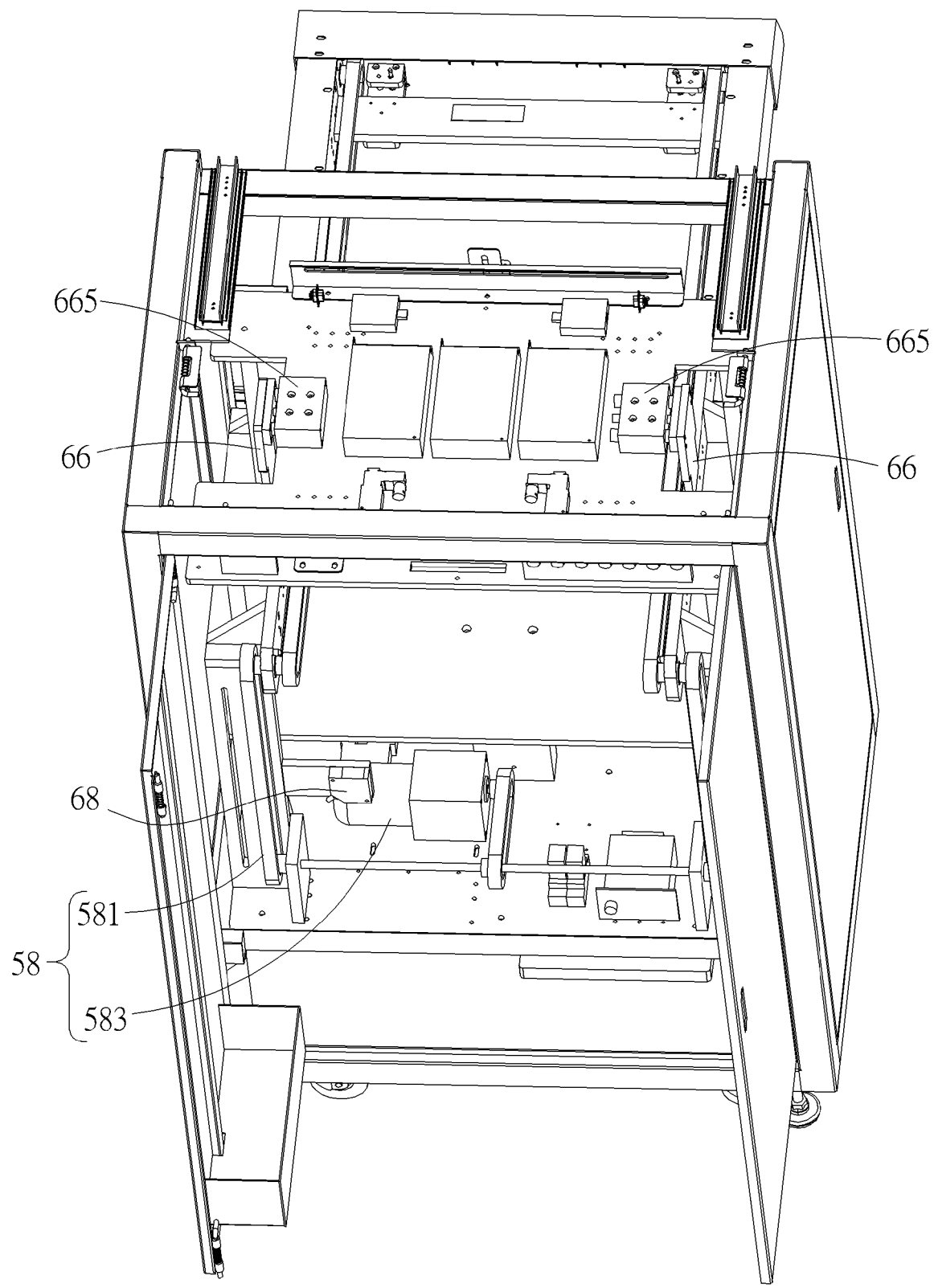
FIG. 8 is a top view diagram of the automation testing system according to the embodiment of the present invention.

Please refer to FIG. 7 and FIG. 8. FIG. 7 is an exploded diagram of a plug detection unit 66 according to the embodiment of the present invention. FIG. 8 is a top view diagram of the automation testing system 5 according to the embodiment of the present invention. The automation testing system 5 further includes a detachable plug detection unit 66 including a plug detection module 661, a linear slide rail 663 and cylinder 665. The plug detection module 661 is electrically connected to the console computer 62 and for plugging into the motherboard 48 so that the console computer 62 tests the motherboard 48 through the plug detection module 661. The linear slide rail 663 is for guiding the plug detection module 661. The cylinder 665 is connected to the plug detection module 661, the console computer 62 is further for controlling the cylinder 665 to push the plug detection module 661 to plug into the motherboard 48 for testing. According to the embodiment, the plug detection unit 66 is installed on the first jig plate 52, but not limited to this. It is able to install different plug detection unit 66 on the automation testing system 5 for testing different motherboard 48.

In addition, please refer to FIG. 1 and FIG. 2. The console computer 62 is further electrically connected to a sensor 68 and a barcode scanner 70. The sensor 68 is installed on the frame 50 for sensing a relative position between the motherboard 48 and the platform 56, and for sensing the platform 56 to be moved to the horizontal position in the first direction D1 relative to the second jig plate 54. The console computer 62 controls the first driving mechanism 58 and the second driving mechanism 60 according to a sensing result of the sensor 68. The barcode scanner 70 is installed on the frame 50 for scanning a barcode on the motherboard 48 and recording the barcode in the console computer 62.

In addition, the first jig plate 52 or the second jig plate 54 includes a probe 523. An end of the probe 523 is electrically connected to the console computer 62, and the other end of the probe 523 is for connecting with the motherboard 48, so as to electrically connect the console computer 62 to the motherboard 48. The console computer 62 monitors the motherboard 48 through a virtual network computing function.

Figure 9:
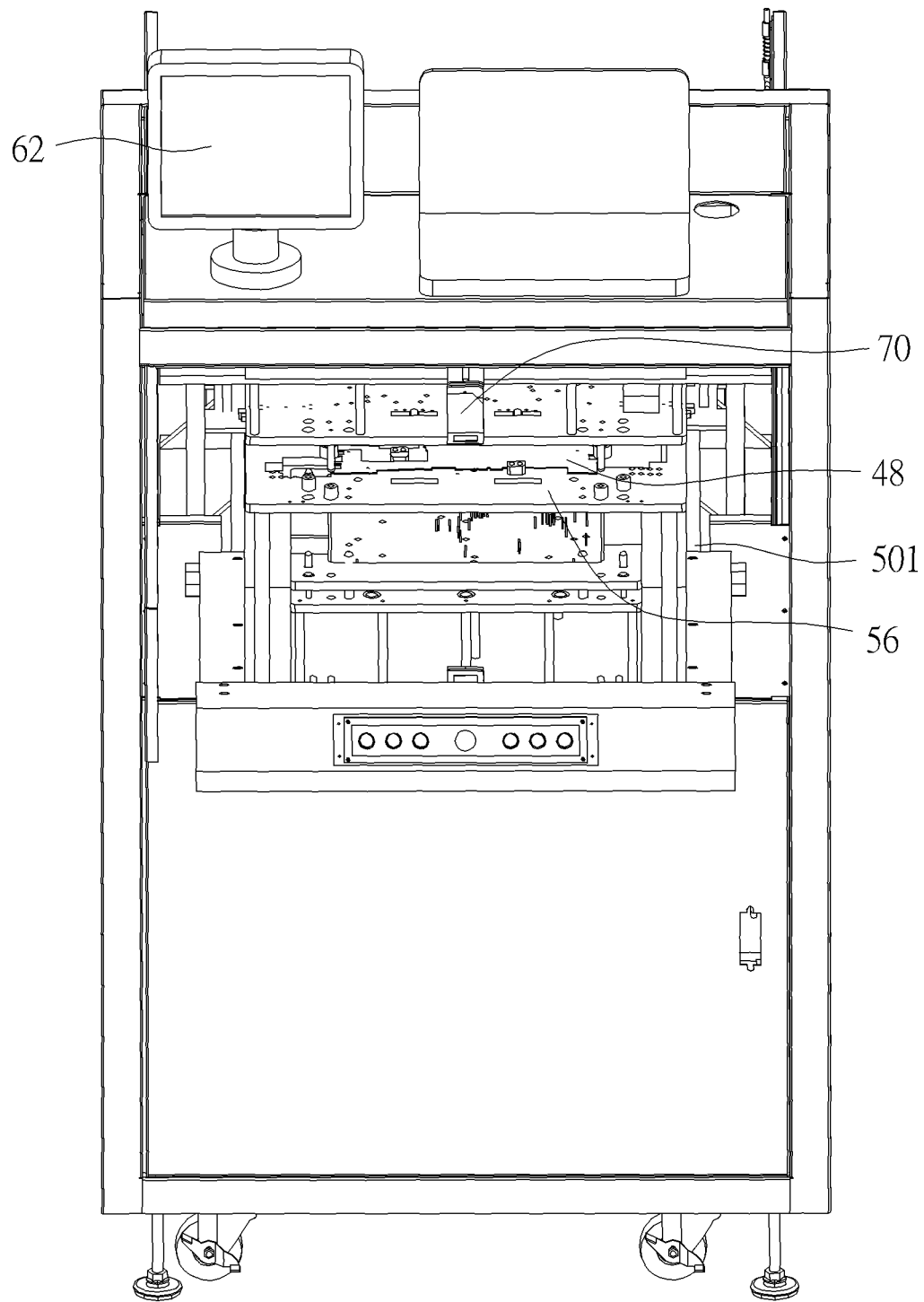
FIG. 9 is a diagram of a platform moved to a horizontal position according to the embodiment of the present invention.
Figure 10:
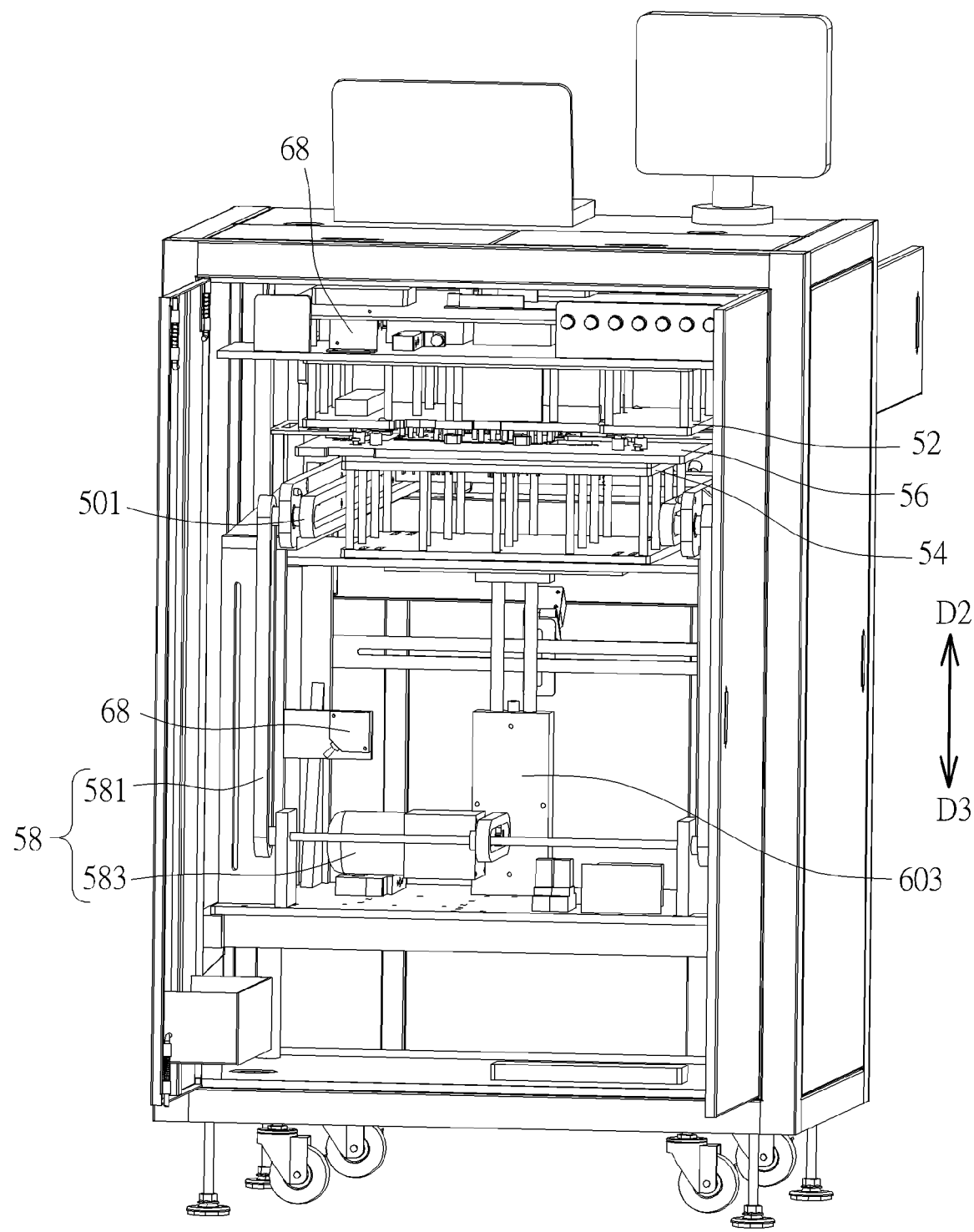
FIG. 10 is a diagram of the first jig plate combined with a second jig plate and the platform according to the embodiment of the present invention.

The operation of the automation testing system 5 according to the embodiment of the present invention is detail as follows. Please refer to FIG. 3, FIG. 5, FIG. 9 and FIG. 10. FIG. 9 is a diagram of the platform 56 moved to a horizontal position according to the embodiment of the present invention. FIG. 10 is a diagram of the first jig plate 52 combined with the second jig plate 54 and the platform 56 according to the embodiment of the present invention. As testing the motherboard 48, the motherboard 48 is loaded on the platform 56. As the sensor 68 senses the motherboard 48 to be placed directly, the console computer 62 controls the motor 583 to drive the transmission chain 581 so as to track the platform 56 to move to the horizontal position along the track 501 in the first direction D1, as shown in FIG. 9. As the sensor 68 senses the platform 56 is moved to the horizontal position, the barcode scanner 70 scans the barcode on the motherboard 48 and sends the record back to the console computer 62. The pneumatic cylinder 603 pushes the second jig plate 54 to move in the second direction D2 along the guiding column 601, and the second jig plate 54 pushes the platform 56 to move toward the first jig plate 52 in the second direction D2. The moving distance of a stroke of the pneumatic cylinder 603 is determined, the platform 56, the first jig plate 52 and the second jig plate 54 are combined together as the stroke is over, as shown in FIG. 10. At The same time, the resilient component 64 is pressed, and the connector 5211 of the debug docking board 521 connects with the motherboard 48. Furthermore, the console computer 62 controls the cylinder 665 to push the plug detection module 661 to plug into the motherboard 48, so that the console computer 62 is able to test the motherboard 48 through a virtual network computing function.

As the testing is over, the console computer 62 controls the cylinder 665 to drive the plug detection module 661 to detach from the motherboard 48, the console computer 62 also controls the pneumatic cylinder 603 to drive the platform 56 and the second jig plate 54 to move in the third direction D3. At the same time, the resilient force of the resilient component 64 pushes the connector 5211 of the debug docking board 521 to detach from the motherboard 48, and the platform 56 and the second jig plate 54 is detached from the first jig plate 52. As the stroke of the pneumatic cylinder 603 is over, the platform 56 is detached from the second jig plate 54. And then, the motor 583 drives the transmission chain 581 to tracking the platform 56 to move to an initial position in a direction opposite to the first direction D1. Then the tested motherboard 48 can be taken off, and another motherboard 48 can be loaded for the next test.

In contrast to the prior art, according to the present invention, the debug docking board is installed on the first jig plate. As testing different kind of motherboards, just replacing the debug docking boards instead of replacing the jig plate, the time spent in replacement and in adjustment can be decreased, and the jig plate can be standardized. During operation, all an operator needs to do is to load the motherboard on the platform without any other manual operation. The testing system approaches fully automatic. The issue that the waste of manpower and time caused by installing the debug docking board on the motherboard manually and loading the motherboard on the testing system can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An automation testing system for testing a motherboard, the automation testing system comprising:
   a frame comprising a track;
   a first jig plate detachably disposed in the frame, a debug docking board being detachably disposed on the first jig plate, the debug docking board comprising a connector for connecting with the motherboard;
   a second jig plate movably disposed in the frame;
   a platform slidably installed on the track and disposed between the first jig plate and the second jig plate, the track being for guiding the platform to move in a first direction, and the platform being for loading the motherboard;
   a first driving mechanism for driving the platform to move along the track in the first direction;
   a second driving mechanism for driving the second jig plate to move in a second direction perpendicular to the first direction; and
   a console computer electrically connected to the debug docking board, the first driving mechanism and the second driving mechanism, the console computer being for controlling the first driving mechanism to drive the platform to a horizontal position, the console computer being further for controlling the second driving mechanism to drive the second jig plate to move in the second direction as the platform is located at the horizontal position, so that the second jig plate pushes the platform to move toward the first jig plate for docking the motherboard with the connector of the debug docking board so as to test the motherboard.

2. The automation testing system of claim 1, wherein the first driving mechanism comprises a transmission chain and a motor, the transmission chain is connected to the platform, and the motor is for driving the transmission chain to move the platform.

3. The automation testing system of claim 1, wherein the second driving mechanism comprises a plurality of guiding columns and a pneumatic cylinder, the plurality of guiding columns is for guiding the second jig plate to move in the second direction, and the pneumatic cylinder is for driving the second jig plate to move in the second direction so as to combine the first jig plate and the platform with the second jig plate or in a third direction opposite to the second direction.

4. The automation testing system of claim 3, further comprising a resilient component contacting against the first jig plate and the motherboard, the resilient component being for pushing the motherboard to detach from the first jig plate as the pneumatic cylinder drives the second jig plate to move in the third direction.

5. The automation testing system of claim 1, further comprising a plug detection unit comprising:
   a plug detection module electrically connected to the console computer and for plugging into the motherboard so that the console computer tests the motherboard through the plug detection module;

a linear slide rail for guiding the plug detection module; and a cylinder connected to the plug detection module, the console computer being further for controlling the cylinder to push the plug detection module to plug into the motherboard.

6. The automation testing system of claim 1, wherein the console computer monitors the motherboard through a virtual network computing function.

7. The automation testing system of claim 1, wherein the first jig plate or the second jig plate comprises a probe, an end of the probe is electrically connected to the console computer, and the other end of the probe is for connecting with the motherboard, so as to electrically connect the console computer to the motherboard.

8. The automation testing system of claim 1, further comprising a sensor for sensing a relative position between the motherboard and the platform, and the console computer being further for controlling the first driving mechanism and the second driving component according to a sensing result of the sensor.

9. The automation testing system of claim 1, further comprising a barcode scanner electrically connected to the console computer, and the barcode scanner being for scanning a barcode on the motherboard and recording the barcode in the console computer.

10. The automation testing system of claim 1, wherein a first positioning pillar and a second positioning pillar are disposed on the first jig plate and the second jig plate respectively, the first positioning pillar is inserted into a first positioning opening on the second jig plate, the second positioning pillar is inserted into a second positioning opening on the first jig plate so as to fix the first jig plate, the platform and the second jig plate.

* * * * *